(12) United States Patent
Ha et al.

(10) Patent No.: US 10,566,514 B2
(45) Date of Patent: Feb. 18, 2020

(54) THERMOELECTRIC MODULE

(71) Applicant: KOREA INSTITUTE OF MACHINERY & MATERIALS, Daejeon-si (KR)

(72) Inventors: Gook Hyun Ha, Busan-si (KR); Ji Hun Yu, Busan-si (KR); Gil Gun Lee, Busan-si (KR)

(73) Assignee: Korea Institute of Machinery & Materials, Daejeon-si (KR)

( * ) Notice: Subject to any disclaimer, the term of this patent is extended or adjusted under 35 U.S.C. 154(b) by 0 days.

(21) Appl. No.: 15/908,719

(22) Filed: Feb. 28, 2018

(65) Prior Publication Data

US 2018/0190893 A1 Jul. 5, 2018

Related U.S. Application Data

(62) Division of application No. 12/596,445, filed as application No. PCT/KR2008/002018 on Apr. 10, 2008, now abandoned.

(30) Foreign Application Priority Data

Apr. 17, 2007 (KR) ........................ 10-2007-00037285

(51) Int. Cl.
 *H01L 35/32* (2006.01)
 *H01L 35/34* (2006.01)

(52) U.S. Cl.
 CPC .............. *H01L 35/32* (2013.01); *H01L 35/34* (2013.01)

(58) Field of Classification Search
 CPC ................................. H01L 35/32; H01L 35/34
 See application file for complete search history.

(56) References Cited

U.S. PATENT DOCUMENTS

| 5,318,743 | A | * | 6/1994 | Tokiai | B22F 1/0003 |
| | | | | | 257/64 |
| 5,430,322 | A | * | 7/1995 | Koyanagi | B64G 1/421 |
| | | | | | 136/203 |
| 6,127,619 | A | * | 10/2000 | Xi | H01L 35/16 |
| | | | | | 136/201 |
| 2003/0089391 | A1 | * | 5/2003 | Fukudome | H01L 35/16 |
| | | | | | 136/227 |
| 2005/0139249 | A1 | * | 6/2005 | Ueki | H01L 35/32 |
| | | | | | 136/211 |

* cited by examiner

*Primary Examiner* — Matthew T Martin
(74) *Attorney, Agent, or Firm* — Lewis Roca Rothgerber Christie LLP

(57) ABSTRACT

Provided is a thermoelectric module including electrodes and P-type and N-type semiconductors formed on a substrate by a printing method. The thermoelectric module includes upper and lower substrates (110 and 120) formed of ceramic or aluminum and forming upper and lower surfaces of the thermoelectric module; electrodes (130) disposed on surfaces of the upper and lower substrates (110 and 120), the electrodes being formed of an electrically conductive material for transmitting electric power; a plurality of P-type and N-type semiconductors (140 and 150) spaced between the electrodes (130), the P-type and N-type semiconductors (140 and 150) being forming by sintering a paste mixture of thermoelectric powder and an organic solvent, wherein the electrodes (130) and the P-type and N-type semiconductors (140 and 150) are formed by a printing method. With this configuration, thin thermoelectric module having various sizes and shapes can be provided.

8 Claims, 5 Drawing Sheets

[Fig. 1]
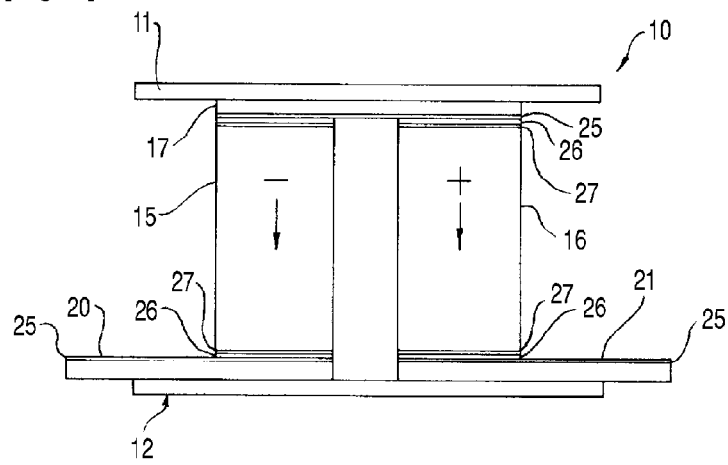
[Fig. 2]
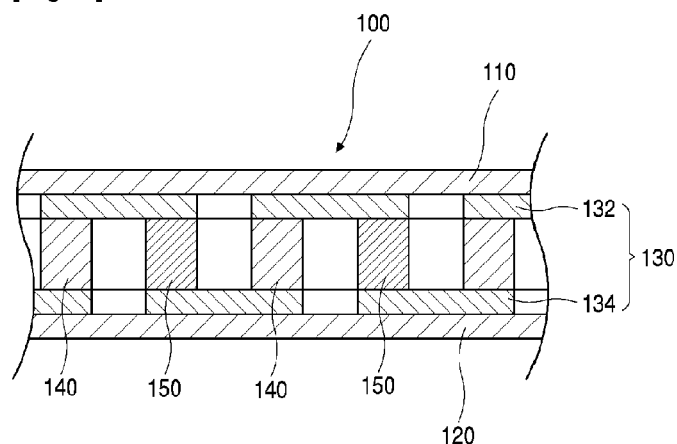
[Fig. 3]
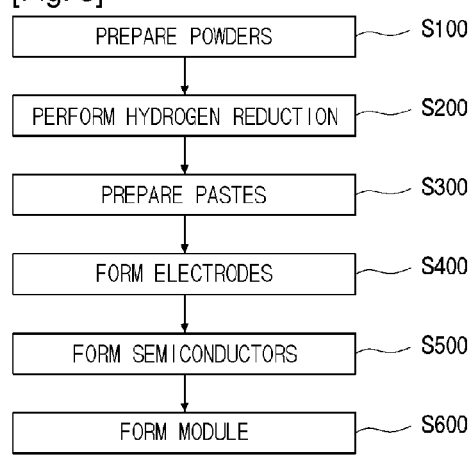

[Fig. 4]
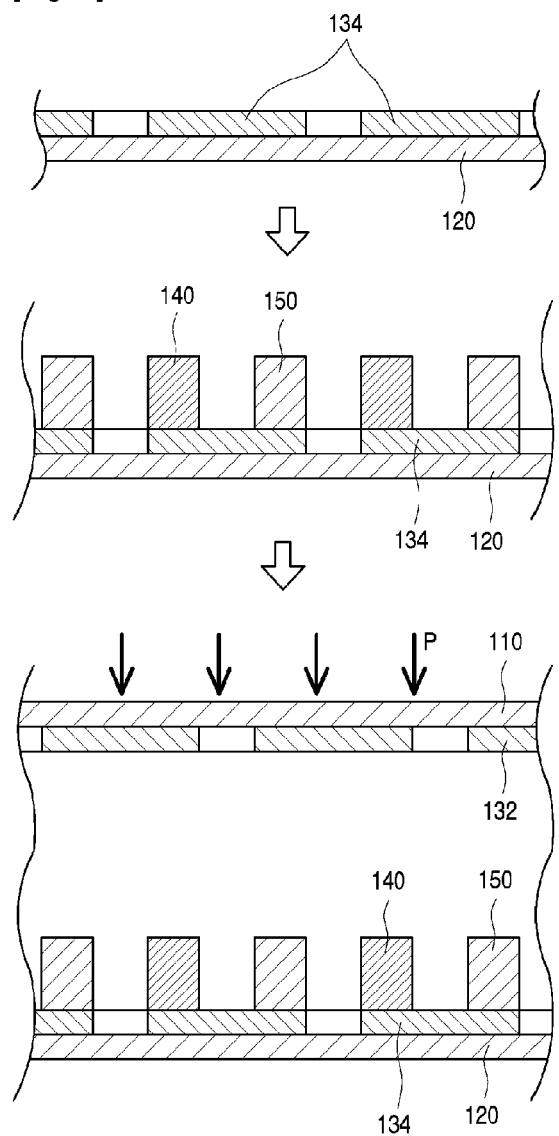
[Fig. 5]
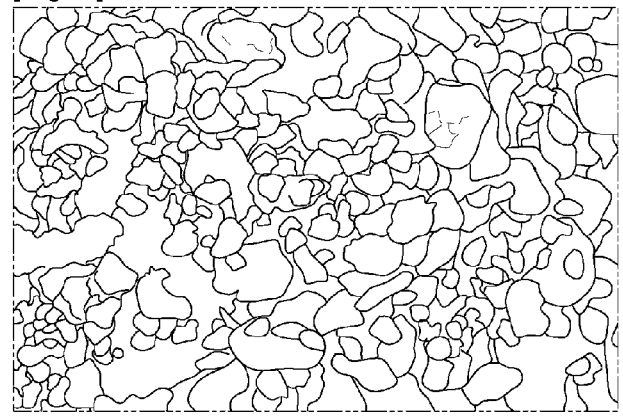

[Fig. 6]
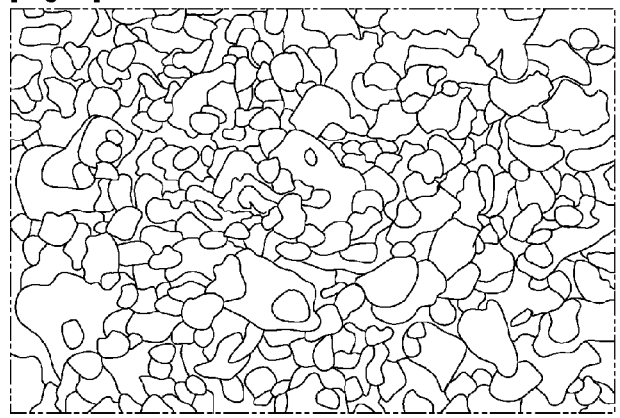
[Fig. 7]
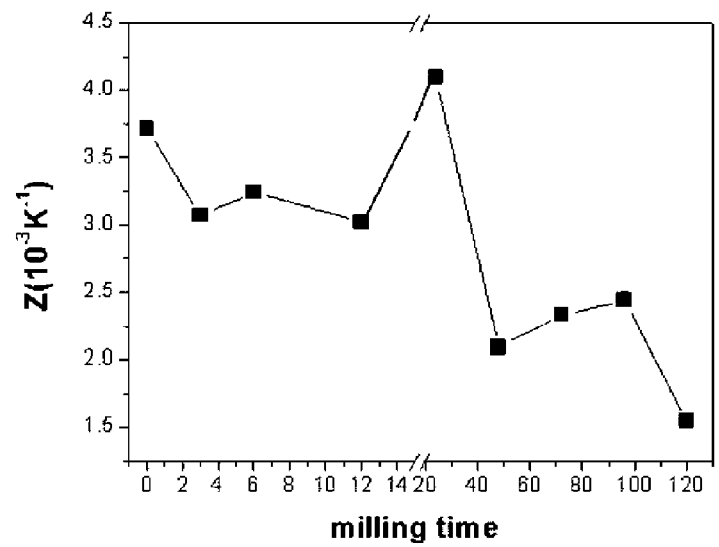
[Fig. 8]
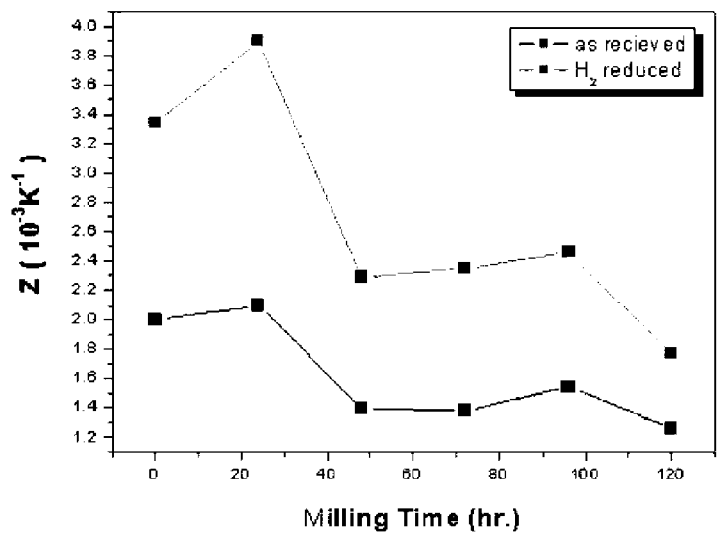

[Fig. 9]
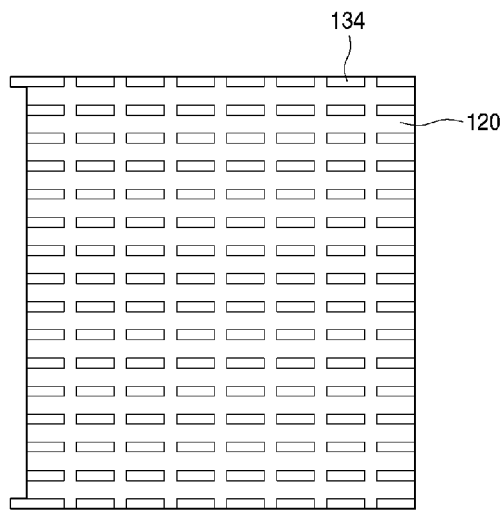
[Fig. 10]
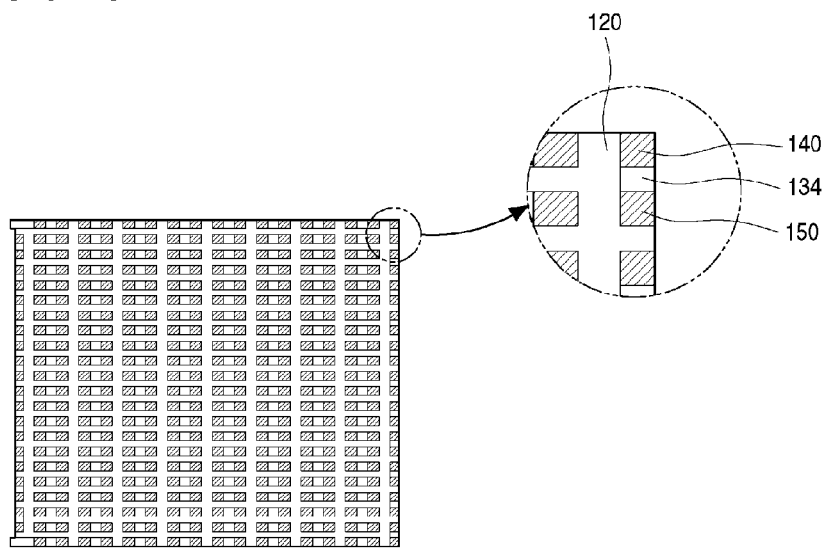
[Fig. 11]
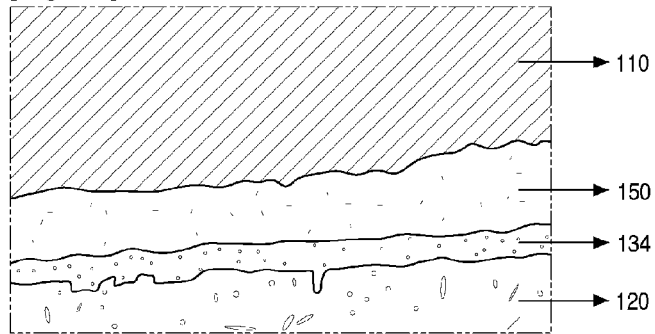

[Fig. 12]
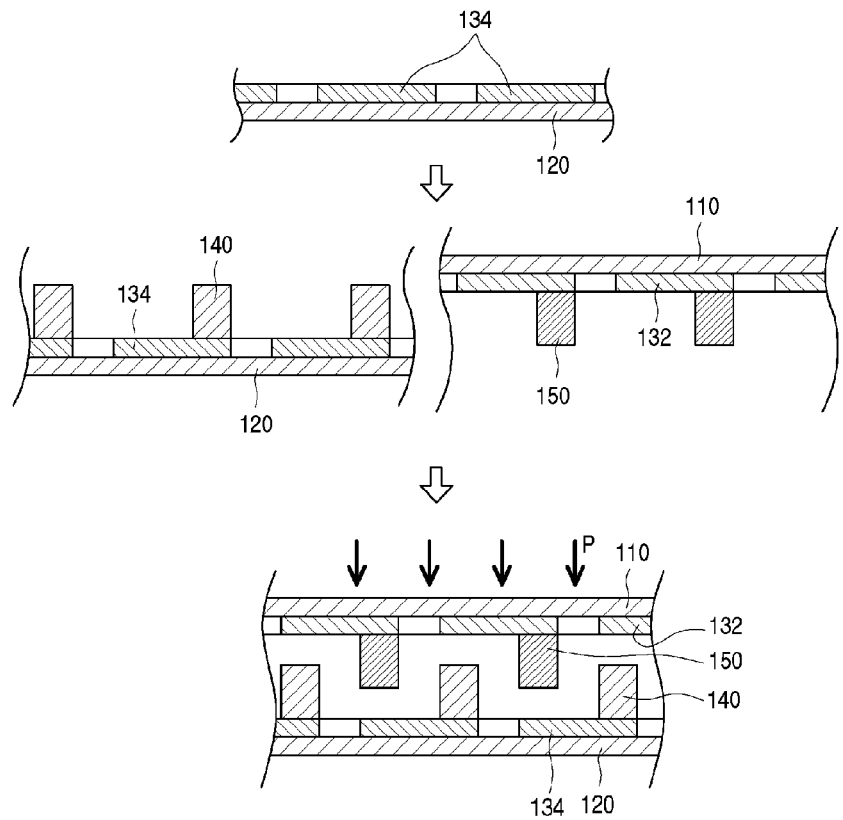
[Fig. 13]
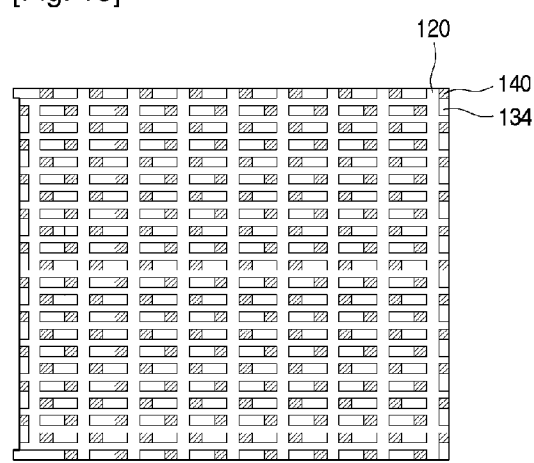

THERMOELECTRIC MODULE

CROSS-REFERENCE TO RELATED APPLICATION(S)

This application is a divisional of U.S. patent application Ser. No. 12/596,445, filed on Dec. 22, 2010, which is a National Phase Patent Application and claims priority to and the benefit of International Application Number PCT/KR2008/02018, filed on Apr. 10, 2008, which claims priority to Korean Patent Application Number 10-2007-00037285, filed on Apr. 17, 2007, the entire contents of all of which are incorporated herein by reference.

TECHNICAL FIELD

The present disclosure relates to a thermoelectric module including electrodes and P-type and N-type semiconductors formed on substrates by a printing method.

BACKGROUND ART

Thermoelectric modules are used for generating electricity using the Seeback effect or for cooling objects using the Peltier effect.

Different temperatures of two sides can be converted into electrical voltage. This is called the Seeback effect. Examples of thermoelectric modules using the Seeback effect include waste-heat thermoelectric generators, body-heat thermoelectric generators for small electronic devices such as electronic clocks, radioactive-decay-heat thermoelectric generators for spacecrafts.

When an electric current flows through two sides, heat is transferred from one side to the other side. Thus, one side is cooled and the other side is heated. This is called the Peltier effect. Therefore, it is possible to provide thermoelectric cooling devices that can cool objects only using an electric current without using a mechanical cooling cycle.

In general, thermoelectric cooling devices have low efficiency as compared with traditional compressor cooling devices. However, the thermoelectric cooling devices do not produce mechanical noise and are advantageous in precise and fast temperature controlling. In addition, the thermoelectric cooling devices have a relatively high efficiency at an operation temperature of about 5 to about 10 degrees Celsius or in small-sized applications.

An exemplary thermoelectric module of the related art will now be described with reference to the accompanying drawing.

Referring to FIG. 1, a thermoelectric module 10 includes an upper substrate 11 and a lower substrate 12. The upper and lower substrates 11 and 12 absorb or emit heat. The upper and lower substrates 11 and 12 are vertically disposed at a predetermined distance apart from each other.

An N-type semiconductor 15 and a P-type semiconductor 16 are disposed between the upper and lower substrates 11 and 12. Each of the N-type semiconductor 15 and the P-type semiconductor 16 is formed of a thermoelectric material and has a predetermined size and shape. Practically, N-type semiconductors 15 and P-type semiconductors 16 are disposed in turn between the lower substrates 15 and 16.

A connection line 17 is disposed between the upper substrate 11 and the N-type and P-type semiconductors 15 and 16. The connection line 17 connects the N-type and P-type semiconductors 15 and 16.

A metal layer 25 is disposed under the connection line 17. The metal layer 25 prevents atoms from moving from the connection line 17 to the N-type and P-type semiconductors 15 and 16. The metal layer 25 is formed of nickel (Ni) having a small amount of phosphor or boron.

That is, the metal layer 25 prevents deterioration of thermoelectric characteristics of the thermoelectric module 10 and stabilizes the thermoelectric characteristics of the thermoelectric module 10. The metal layer 25 is formed on the connection line by a predetermined coating method.

A barrier layer 27 is disposed between the N-type and P-type semiconductors 15 and 16. The barrier layer 27 prevents the N-type and P-type semiconductors 15 and 16 from being contaminated by a soldering layer 26.

The soldering layer 26 is disposed between the metal layer 25 and the barrier layer 27. The soldering layer 26 bonds together the metal layer 25 and the barrier layer 27.

An N contact 20 and a P contact 21 are disposed on a bottom surface of a lower soldering layer 26.

The N and P contacts 20 and 21 are spaced apart from each other and are attached to bottom surfaces of the N-type and P-type semiconductors 15 and 16 for supplying power to the N-type and P-type semiconductors 15 and 16.

However, the thermoelectric module 10 of the related art has the following problems. The soldering layers 26 are disposed at top and bottom surfaces of the N-type and P-type semiconductors 15 and 16 for fixing the N-type and P-type semiconductors 15 and 16 to the upper and lower substrates 11 and 12.

That is, the thermoelectric module 10 contains a harmful material that may affect operator's health. Furthermore, due to the soldering layer 26, the barrier layer 27 is additionally necessary. This increases the thickness of the thermoelectric module 10 and the number of manufacturing operations of the thermoelectric module 10, resulting in a high defect rate.

Moreover, since a soldering operation for forming the soldering layer 26 consumes much time, the productivity of the manufacturing operations of the thermoelectric module 10 is low, and thus the price of the thermoelectric module 10 is high.

DISCLOSURE OF INVENTION

Technical Problem

Accordingly, embodiments are directed to a thermoelectric module that substantially obviates one or more of the problems due to limitations and disadvantages of the related art. Embodiments provide a thin thermoelectric module including electrodes and P-type and N-type semiconductors formed by a printing method, specifically, a screen printing method.

Embodiments also provide thermoelectric modules having various sizes and shapes using a screen printing method.

Technical Solution

In one embodiment, a thermoelectric module includes: upper and lower substrates formed of ceramic or aluminum and forming upper and lower surfaces of the thermoelectric module; electrodes disposed on surfaces of the upper and lower substrates, the electrodes being formed of an electrically conductive material for transmitting electric power; a plurality of P-type and N-type semiconductors spaced between the electrodes, the P-type and N-type semiconductors being forming by sintering a paste mixture of thermoelectric powder and an organic solvent, wherein the electrodes and the P-type and N-type semiconductors are formed using a printing method.

The electrodes may be formed by sintering a paste mixture of silver (Ag) or copper (Cu) powder and an organic solvent.

The paste mixture may include about 40% to about 95% by volume of the thermoelectric power.

The organic solvent mixed with the thermoelectric powder may be removed at a temperature equal to or lower than a sintering temperature of the thermoelectric powder.

The printing method may be a screen printing method.

Advantageous Effects

In the present disclosure, the electrodes and the P-type and N-type semiconductors are formed on the substrates by a screen printing method. Therefore, the thicknesses of the electrodes and the P-type and N-type semiconductors can be precisely controlled for making the thermoelectric module very thin.

In addition, thermoelectric modules having various sizes and shapes can be provided. Moreover, since the thermoelectric module can be fabricated through a simple process, the productivity of the fabrication process can be high, and the thermoelectric module can be fabricated at low costs.

BRIEF DESCRIPTION OF THE DRAWINGS

FIG. 1 is a vertical sectional view illustrating a thermoelectric module of the related art.

FIG. 2 is a vertical sectional view illustrating a thermoelectric module according to the present disclosure.

FIG. 3 is a flowchart illustrating a method of fabricating a thermoelectric module according to the present disclosure.

FIG. 4 is a vertical sectional view illustrating changes of the thermoelectric module during fabrication operations according to an embodiment.

FIG. 5 is an enlarged image illustrating ball-milled P-type semiconductor powder used for fabricating the thermoelectric module according to the present disclosure.

FIG. 6 is an enlarged image illustrating ball-milled N-type semiconductor powder used for fabricating the thermoelectric module according to the present disclosure.

FIG. 7 is a chart illustrating a thermoelectric characteristic of the thermoelectric module with respect to ball milling conditions of the P-type semiconductor powder according to the present disclosure.

FIG. 8 is a chart illustrating thermoelectric characteristics of the thermoelectric module before and after a hydrogen reduction operation according to the present disclosure.

FIG. 9 is a plan view illustrating the thermoelectric module after an electrode forming operation according to the present disclosure.

FIG. 10 is a plan view illustrating the thermoelectric module after a semiconductor forming operation according to an embodiment of the present disclosure.

FIG. 11 is an enlarged image illustrating the thermoelectric module after a module forming operation according to the present disclosure.

FIG. 12 is a vertical sectional view illustrating changes of a thermoelectric module during fabrication operations according to another embodiment.

FIG. 13 is a plan view illustrating the thermoelectric module after a semiconductor forming operation according to another embodiment of the present disclosure.

DETAILED DESCRIPTION

A thermoelectric module will now be described in detail with reference to FIG. 2 according to an embodiment.

FIG. 2 is a vertical sectional view illustrating a thermoelectric module according to the present disclosure.

Referring to FIG. 2, a thermoelectric module 100 includes upper and lower substrates 110 and 120. The upper and lower substrates 110 and 120 form the upper and lower exteriors of the thermoelectric module. The upper and lower substrates 110 and 120 generate or absorb heat in response to power applied to the thermoelectric module 100. The upper and lower substrates 110 and 120 are formed of a material having a high thermal conductivity and strength.

Electrodes 130 are disposed between a bottom surface of the upper substrate 110 and a top surface of the lower substrate 120. The electrodes 130 transfer power applied to the thermoelectric module 100. The electrodes 130 include upper electrodes 132 disposed on the bottom surface of the upper substrate 110 and lower electrodes 134 disposed on the top surface of the lower substrate 120. A P-type semiconductor 140 and an N-type semiconductor 150 are disposed on each surface of the upper and lower electrodes 132 and 134 at a predetermined distance from each other. In detail, a P-type semiconductor 140 is disposed on a bottom left surface of the upper electrode 132, and an N-type semiconductor 150 is disposed away from the right side of the P-type semiconductor 140. That is, the N-type semiconductor 150 is disposed on a top left surface of the lower electrode 134. Then, another P-type semiconductor 140 is disposed away from the right side of the N-type semiconductor 150.

Therefore, when power is supplied to the thermoelectric module 100, an electric current may flow through the P-type and N-type semiconductors 140 and 150 that are electrically connected in series in an alternating manner between the upper substrate 110 and the lower substrate 120.

The upper and lower substrates 110 and 120 are formed of a material having a high thermal conductivity so as to minimize power consumption of the thermoelectric module 100. For example, the upper and lower substrates 110 and 120 may be formed of silver (Ag) or copper (Cu).

The P-type and N-type semiconductors 140 and 150 are disposed between the upper and lower substrates 110 and 120. The P-type and N-type semiconductors 140 and 150 are formed by sintering a paste mixture of thermoelectric powder and an organic solvent. Well-known thermoelectric materials may be used as thermoelectric powder. Thus, a description of the thermoelectric powder will be omitted.

A method of fabricating a thermoelectric module 100 will now be described with reference to FIGS. 3 to 11 according to an embodiment.

FIG. 3 is a flowchart illustrating a method of fabricating a thermoelectric module according to the present disclosure, and FIG. 4 is a vertical sectional view illustrating changes of the thermoelectric module during fabrication operations according to an embodiment. FIGS. 5 to 7 are enlarged images of ball-milled powders of a P-type semiconductor 140 and a N-type semiconductor 150 and a thermoelectric characteristic chart.

FIG. 8 is a chart illustrating thermoelectric characteristics of the thermoelectric module before and after a hydrogen reduction operation according to the present disclosure. FIGS. 9 and 10 are plan views illustrating the thermoelectric module after an electrode forming operation and a semiconductor forming operation according to the present disclosure, and FIG. 11 is an enlarged image illustrating the thermoelectric module after a module forming operation according to the present disclosure.

First, an upper substrate 110 and a lower substrate 120 are prepared. Then, thermoelectric powders for forming P-type and N-type semiconductors 140 and 150 are prepared in operation S100. In operation S100, fine thermoelectric powders and metal powder such as aluminum power are fabricated through a ball milling operation for preparing an electrode forming operation (S400) and a semiconductor forming operation (S500).

In the ball milling operation, raw materials are mechanically pulverized by compressing, shearing, impacting, or a combination thereof.

After the ball milling operation, thermoelectric powders having a diameter not larger than 2 .mu.m are obtained as shown in FIGS. 5 and 6. The ball milling operation may be performed for about 1 hour to about 100 hours. The reason for this is that the thermoelectric characteristics of the thermoelectric powders are best when the ball milling operation is performed for about 1 hour to about 100 hours as shown in FIG. 7. In operation S200, the thermoelectric powders are reduced using hydrogen. The hydrogen reduction is performed to improve the thermoelectric characteristics of the thermoelectric powders. As shown in FIG. 8, the thermoelectric characteristics of the thermoelectric powders are improved after the hydrogen reduction.

In operation S300, the thermoelectric powders are mixed with an organic solvent to form thermoelectric pastes.

The organic solvent can be completely removed from the thermoelectric pastes at a temperature lower than sintering temperatures of the thermoelectric powder. The thermoelectric paste contains 40% to 95% by volume of the thermoelectric powder. If the volume percentage of the thermoelectric powder is lower than 40%, many voids may be generated after sintering. On the other hand, if the volume percentage of the thermoelectric powder is higher than 94%, the fluidity of the thermoelectric paste is low, and thus it is difficult to apply the thermoelectric paste by printing.

Thereafter, in operation S400, a metal mask (not shown) or a metal mash (not shown) is placed on the upper substrate 110 or the lower substrate 120, and then the metal powder such as silver or copper powder is allowed to pass through the metal mask or the metal mash to form electrodes 130.

In detail, the metal mask or metal mash has a fine hole pattern corresponding to the electrodes 130. The metal powder such as silver or copper powder is allowed to pass through fine holes of the metal mask or metal mash to form upper electrodes 132 or lower electrodes 134 on the upper substrate 110 or the lower substrate 120. That is, this operation is a screen printing operation.

Once the electrodes 130 are formed on the upper substrate 110 or the lower substrate 120 by screen printing using the metal powder, the electrodes 130 should not be detached from the upper substrate 110 or the lower substrate 120. For this, the metal powder may be used in the form of paste using an organic solvent.

The upper electrodes 132 or the lower electrodes 134 formed in operation S400 are shown in FIG. 4. The upper electrodes 132 or the lower electrodes 134 are spaced at regular intervals as shown in FIG. 9.

Thereafter, the upper electrodes 132 or the lower electrodes 134 are treated at a temperature of about 600.degree. C. to about 800.degree. C. for about 1 hour to 3 hours so as to remove the organic solvent.

In operation S500, P-type semiconductors 140 and N-type semiconductors 150 are formed on bottom surfaces of the upper electrodes 132 or top surfaces of the lower electrodes 134 (in the current embodiment, on the top surfaces of the lower electrodes 134).

In detail, the P-type and N-type semiconductors 140 and 150 are simultaneously formed on the top surfaces of the lower electrodes 134 at predetermined intervals. Like in the electrode forming operation S400, the P-type and N-type semiconductors 140 and 150 are formed by a screen printing method.

In more detail, a metal mask or a metal mash is placed on the top surfaces of the lower electrodes 134, and the thermoelectric paste prepared in S100 is allowed to pass through the metal mask or the metal mash so as to form the P-type and N-type semiconductors 140 and 150 on the top surfaces of the lower electrodes 134.

The metal mask or the metal mash used in operation S500 has a fine hole pattern corresponding to the P-type and N-type semiconductors 140 and 150.

The second region of FIG. 4 illustrates the lower substrate 120 after the semiconductor forming operation (S500). Referring to FIG. 10, in a given column, the P-type and N-type semiconductors 140 and 150 are arranged at predetermined intervals in an alternating manner.

The P-type and N-type semiconductors 140 and 150 formed on the electrode 130 are treated in a non-oxidation atmosphere at a temperature of about 250.degree. C. or lower for about 1 hour to about 3 hours, in order to remove the organic solvent from the thermoelectric paste.

In operation S600, the upper substrate 110 on which the upper electrodes 132 are formed in operation S400 is bonded to the lower substrate 120 on which the P-type and N-type semiconductors 140 and 150 are formed in operation S500.

In detail, the upper substrate 110 on which the upper electrodes 132 are formed in operation S400 is placed in a die (not shown) together with the lower substrate 120 on which the P-type and N-type semiconductors 140 and 150 are formed in operation S500 after orienting the upper and lower substrates 110 and 120 as shown in the lowermost region of FIG. 4. Then, the upper and lower substrates 110 and 120 are sintered by pressing and heating.

The sintering is performed in a temperature range in which thermoelectric powder is generally sintered. In the current embodiment, the sintering is performed in the temperature range from about 300.degree. C. to about 550.degree. C. since Bi—Te—Sb or Bi—Te—Se thermoelectric powder is used. The sintering may be started in a vacuum and then continued in a non-oxidation atmosphere.

A method of fabricating a thermoelectric module will now be described with reference to FIGS. 12 and 13 according to another embodiment.

FIG. 12 is a vertical sectional view illustrating changes of a thermoelectric module during fabrication operations according to another embodiment, and FIG. 13 is a plan view illustrating the thermoelectric module after a semiconductor forming operation according to another embodiment of the present disclosure.

In the following description, the same operations as those of the previous embodiment will not be described in detail. The differences in semiconductor forming operation S500 and module forming operation S600 will be described in detail.

In semiconductor forming operation S500, N-type semiconductors 150 are formed on bottom surfaces of upper electrodes 132 formed on an upper substrate 110, and P-type semiconductors 140 are formed on top surfaces of lower electrodes 134 formed on a lower substrate 120. The N-type semiconductors 150 and the P-type semiconductors 140 are formed by screen printing using metal masks or metal mashes.

A pair of metal masks or metal mashes is prepared: one for forming the N-type semiconductors 150, and the other for forming the P-type semiconductors 140. For this, the pair of metal masks or metal mashes has different fine hole patterns.

In other words, since the metal masks or metal mashes are used for forming the P-type and N-type semiconductors 140 and 150, respectively, the fine hole patterns of the metal masks or metal mashes are not aligned when the metal masks or metal mashes are put one on the other.

FIG. 12 shows the P-type and N-type semiconductors 140 and 150 formed using the metal masks or metal mashes. Referring to the lowermost region of FIG. 12, in a given electrode region, a pair of P-type and N-type semiconductors are disposed at a predetermined distance apart from each other.

Thereafter, in operation S600, the upper substrate 110 at which the N-type semiconductors 150 are formed in operation S500 is placed in a die (not shown) together with the lower substrate 120 on which the P-type semiconductors 140 are formed in operation S500. In the die, the upper substrate 110 faces the lower substrate 120 as shown in the lowermost region of FIG. 12. Then, the upper and lower substrates 110 and 120 are sintered by pressing and heating.

The sintering is performed in a temperature range in which thermoelectric powder is generally sintered. In the current embodiment, the sintering is performed in the temperature range from about 300.degree. C. to about 550.degree. C. since Bi—Te—Sb or Bi—Te—Se thermoelectric powder is used. The sintering may be started in a vacuum and then continued in a non-oxidation atmosphere.

Although embodiments have been described with reference to a number of illustrative embodiments thereof, it should be understood that numerous other modifications and embodiments can be devised by those skilled in the art that will fall within the spirit and scope of the principles of this disclosure.

For example, the P-type and N-type semiconductors 140 and 150 are simultaneously formed on the top surfaces of the lower electrodes 134 at predetermined intervals in operation S500 according to an embodiment. However, the P-type and N-type semiconductors 140 and 150 can be formed on the bottom surfaces of the upper electrodes 132 in another embodiment.

What is claimed is:

1. A method of manufacturing a thermoelectric module, the method comprising:
   providing an upper substrate and a lower substrate, the upper substrate forming an upper surface of the thermoelectric module, the lower substrate forming a lower surface of the thermoelectric module;
   separately forming an upper electrode on the upper substrate and a lower electrode on the lower substrate;
   forming a thermoelectric powder for a P-type semiconductor and an N-type semiconductor, wherein the forming the thermoelectric powder comprises ball milling the thermoelectric powder to have a diameter not exceeding 2 µm;
   separately forming the P-type semiconductor and the N-type semiconductor in the form of a paste on surfaces of the upper electrode and the lower electrode, respectively; and
   bonding the upper substrate and the lower substrate together into the thermoelectric module after the separately forming the P-type semiconductor and the N-type semiconductor on the upper electrode and the lower electrode, respectively.

2. The method of claim 1, wherein the forming of the upper electrode, the lower electrode, the P-type semiconductor, and the N-type semiconductor comprises a screen printing process.

3. The method of claim 2, wherein the bonding comprises:
   mounting the upper substrate and the lower substrate within a mold; and
   heating and pressing the upper substrate and the lower substrate into the form of the thermoelectric module.

4. The method of claim 3, further comprising:
   performing a hydrogen reduction on a pulverized thermoelectric powder;
   mixing the thermoelectric powder with an organic solvent to form pastes after the hydrogen reduction; and
   removing the organic solvent.

5. The method of claim 3, wherein the forming of the upper electrode and the lower electrode comprises:
   forming the upper electrode on a bottom surface of the upper substrate, and
   forming the lower electrode on a top surface of the lower substrate, wherein the upper electrode and lower electrode are formed at positions overlapping with each other.

6. The method of claim 1, wherein each of the upper substrate and the lower substrate comprises a material selected from the group consisting of silver, copper, aluminum, and combinations thereof.

7. The method of claim 1, wherein the forming of the upper electrode comprises forming the upper electrode directly connected to the upper substrate, and wherein the forming of the lower electrode comprises forming the lower electrode directly connected to the lower substrate.

8. The method of claim 1, wherein the forming the P-type semiconductor comprises forming the P-type semiconductor directly on the surface of the upper electrode, and wherein the forming the N-type semiconductor comprises forming the N-type semiconductor directly on the surface of the lower electrode.

* * * * *